United States Patent [19]
Schenz et al.

[11] Patent Number: 5,361,901
[45] Date of Patent: Nov. 8, 1994

[54] CARRIER TAPE

[75] Inventors: James L. Schenz, Stillwater, Minn.; Tom Skrtic, Eau Claire, Wis.

[73] Assignee: Minnesota Mining and Manufacturing Company, St. Paul, Minn.

[21] Appl. No.: 201,714

[22] Filed: Feb. 25, 1994

Related U.S. Application Data

[63] Continuation of Ser. No. 9,377, Jan. 27, 1993, abandoned, which is a continuation of Ser. No. 860,204, Mar. 26, 1992, abandoned, which is a continuation of Ser. No. 654,325, Feb. 12, 1991, abandoned.

[51] Int. Cl.$^5$ .............................................. B65D 85/38
[52] U.S. Cl. ..................................... 206/330; 206/332
[58] Field of Search ............................ 206/328-334, 206/820

[56] References Cited

U.S. PATENT DOCUMENTS

| | | | |
|---|---|---|---|
| 4,562,924 | 1/1976 | Okamoto | 206/330 |
| 4,564,880 | 1/1986 | Christ et al. | 361/212 |
| 4,565,288 | 1/1986 | Walther . | |
| 4,615,441 | 10/1986 | Nakamura . | |
| 4,615,441 | 10/1986 | Nakamura . | |
| 4,633,370 | 12/1986 | Hamuro et al. | 206/330 |
| 4,681,221 | 7/1987 | Chickanosky et al. | 206/328 |
| 4,702,370 | 10/1987 | Honda | 206/332 |
| 4,703,920 | 11/1987 | Grabbe et al. . | |
| 4,712,675 | 12/1987 | Scholten et al. . | |
| 4,718,548 | 1/1988 | Estrada et al. . | |
| 4,736,841 | 4/1988 | Kaneko et al. | 206/332 |
| 4,781,953 | 11/1988 | Ball | 206/332 |
| 4,810,616 | 3/1989 | Grabbe et al. . | |
| 4,852,737 | 8/1989 | Noll . | |
| 4,893,764 | 1/1990 | Juntunen | 242/71.9 |
| 4,898,275 | 2/1990 | Skrtic et al. | 206/330 |
| 4,944,797 | 7/1990 | Kemp, Jr. et al. . | |
| 4,966,281 | 10/1990 | Kawanishi et al. . | |
| 4,968,259 | 11/1990 | Korsunsky et al. . | |
| 5,026,303 | 6/1991 | Matsuoka et al. | 206/328 |
| 5,033,615 | 7/1991 | Shima et al. | 206/328 |
| 5,066,245 | 11/1991 | Walker . | |
| 5,076,427 | 12/1991 | Thomson et al. . | |
| 5,101,975 | 4/1992 | Runyon et al. . | |
| 5,152,393 | 10/1992 | Chenoweth | 206/330 |

FOREIGN PATENT DOCUMENTS

| | | | |
|---|---|---|---|
| 0276539A2 | 8/1988 | European Pat. Off. . | |
| 0276539A3 | 8/1988 | European Pat. Off. . | |
| 0350003A3 | 1/1990 | European Pat. Off. . | |
| 0350003A2 | 1/1990 | European Pat. Off. . | |
| 0358063A3 | 3/1990 | European Pat. Off. . | |
| 0358063A2 | 3/1990 | European Pat. Off. . | |
| 62-249444 | 10/1987 | Japan . | |
| 0294463 | 11/1989 | Japan | 206/328 |
| 0127256 | 5/1990 | Japan | 206/330 |
| 3-133762 | 6/1991 | Japan . | |
| 5-229584 | 9/1993 | Japan . | |
| 2163401 | 2/1985 | United Kingdom . | |
| WO90/04915 | 5/1990 | WIPO . | |

Primary Examiner—Jimmy G. Foster
Attorney, Agent, or Firm—Gary L. Griswold; Walter N. Kirn; Peter L. Olson

[57] ABSTRACT

According to the present invention there is provided a unitary flexible carrier tape comprising a strip like portion defining a top surface for the tape, and wall portions defining a plurality of similarly-shaped pockets spaced along the tape and opening through the top surface. The wall portions include bottom wall portions, side wall portions extending between the strip like portion and the bottom wall portions. The bottom wall portions include distal parts spaced from the top surface of the tape and embossed parts projecting above the distal parts and having abutment surfaces spaced above the distal parts. The side wall portions include longitudinal parts extending between the top surface of the tape and the distal parts. The side wall portions also include castellation parts having portions located above the embossed parts and inset from the longitudinal parts.

26 Claims, 3 Drawing Sheets

CARRIER TAPE

This is a continuation of Application No. 08/009,377, filed Jan. 27, 1993, abandoned, which is a continuation of Application No. 07/860,204, filed Mar. 26, 1992, abandoned, which is a continuation of Application No. 07/654,325, filed Feb. 12, 1991 abandoned.

TECHNICAL FIELD

The present invention relates generally to carrier tapes of the type used to transport components from a component manufacturer to a different manufacturer that assembles the components into new products.

BACKGROUND ART

The art is replete with carrier tapes that are used to transport components (e.g. torsion springs, leaf springs, or electronic or electrical components such as resistors, flatpacks, capacitors, or integrated circuits) from a component manufacturer to a different manufacturer that assembles the components into new products, typically by having automated assembly equipment sequentially remove components from the carrier tape and subsequently use them in the assembly of the new products.

One type of carrier tape may comprise a polymeric strip that has been formed to have wall portions defining a series of identical pockets at predetermined uniformly spaced intervals along its length, which pockets are shaped to closely receive identical components that are adapted to be transported by the tape. For example, the pockets may comprise rectangular or generally "I" or "T" shapes in the plane of the strip, and may have flat or rounded bottoms to accommodate the shape of the components.

The tape strips normally have through openings uniformly spaced along each side to receive drive sprockets by which the strip can be driven and to provide indexing holes that can be used for accurately locating the pockets along the tape with respect to assembly equipment. The strips also typically have through apertures along middle portions of each of the pockets to provide a hole that can be used by the assembly equipment to determine whether a component is present within the pocket (e.g. by using an optical scanner).

Typically, the carrier tape is manufactured in a first manufacturing location, wound on a reel (e.g. the reel described in U.S. Pat. No. 4,893,764 the entire contents of which are herein expressly incorporated by reference) and transported to the supplier of the components that it is intended to transport. The component supplier unwinds the carrier tape from the reel, fills the pockets along the carrier tape with components, adheres a removable cover strip along the carrier tape over the component filled pockets, winds the component filled carrier tape with the attached cover strip onto a reel, and transports it to the user who feeds it from the reel into the assembly equipment which removes the components.

While such carrier tape can be formed by continuous injection molding, it is more commonly formed from an initially flat polymeric heated thermoplastic strip using a tool to form the pockets (e.g., male and female die sets, or a male or a female die over which the strip is vacuum formed).

Existing tape carriers encounter problems when they present their carried articles to automated assembly equipment. Maintaining a precise orientation of the carried article relative to the carrier tape is an important element in carrier tape performance. The tape carriers of the prior art tend to allow a misalignment or "shifting" of the orientation of the carried article within the pockets of the carrier tape. The misalignment may be described as a displacement in an X-Y plane or may be described as an angular displacement and may be caused by a variety of phenomenon such as vibration during shipping. Such a misalignment of the orientation of the article within the pocket may cause the automated assembly equipment (used to construct the new product) to position the article in an improper position on a printed circuit board in the new product.

In applications which require that a component be precisely located on a printed circuit board, the automated assembly equipment may include optical scanner mechanisms which are adapted to determine the orientation of the components with respect to the rest of the assembly equipment. Optical scanner mechanisms, however, are costly and require additional time during the assembly process.

One example of a component that may be carried by the carrier tape is a flatpack (i.e. gull wing, J-bend, and flying lead flatpacks) which includes a body and at least one connector pin or "lead" which affords connection of the component to an electrical circuit in the new product to be assembled by the assembly equipment. For example, a flatpack may comprise a rectangular shaped body having side walls defining corners, top and bottom walls and a plurality of leads which are spaced from the corners and which project generally normally away from the side walls and extend below the bottom wall.

Existing carrier tape encounters problems in protecting the carrier components. Generally, the components carried by the carrier tape are extremely sensitive and fragile and should be protected from mechanical damage from bending, fracturing, deflecting, breaking or other distortions in their original shape. Frictional wear is also a problem with the fragile leads. It is believed that leads may be damaged by even slight collisions with the structure of the tape, particularly when the electronic component is removed from the pocket. The three leads which extend the farthest below the bottom wall (i.e. the bottom three leads) define a lowest plane. In many applications, the remaining leads of the component should not be spaced more than 0.004 inches (0.1 mm) from this lowest plane. If a lead is spaced farther than 0.004 inches from this lowest plane, then the lead may not be connected to the circuit on the printed circuit board in the new product circuit on the printed circuit board in the new product resulting in a defective new product.

The art is replete with carrier tapes adapted to protect electrical components. One such tape is disclosed in PCT International Application, International Publication Number WO 90/04915 assigned to Reel Services Limited, GB. That carrier tape comprises a plurality of spaced walls defining identical pockets having projecting portions including rectilinearly extending separated portions and ridges which are aligned with the walls defining the pocket. The electrical component rests on the projecting portions until it is removed by a vacuum pick-up. Due to their close proximity relative to the leads of the electronic component, the projecting portions and ridges offer potential contact points with the leads, thereby increasing the potential for damage to the leads resulting from contact with the structure of the carrier tape. Additionally, when the component is lifted from the projecting portions, it sometimes tends to rotate relative to the bottom wall of the pocket. Such rotation of the electronic component is believed to expose the leads to damage such as bending due to contact with the projecting portions. Any rotation of the component with respect to the carrier tape may result in a misalignment of the component on the new workpiece, an undesirable result.

Electrostatic damage (ESD) is another problem associated with existing carrier tapes. Triboelectric charges may exist on the component prior to its being placed into the carrier tape, or may build on the component if its fit within the pocket is overly loose and thus permits the body of the component to rub against the tape structure and/or the affixed cover tape strip. At some time during the use of the carrier tape, particularly when the electrical component is removed from the tape pocket, such electrostatic charges may be discharged from the component to the carrier tape. Such a discharge may damage the component by, for example, damaging a dielectric layer within the component. This is the result of an excessively rapid discharge in which the resultant change in voltage divided by the change in time ($\Delta V / \Delta t$) across the dielectric layer exceeds the breakdown voltage of the dielectric material thereby causing its perforation. In some components, this damaging voltage differential may be as low as 50 volts or less. Carrier tapes for these types of components will thus have a surface resistance of greater than 10E04 and less than 10E12 (OHMS/square) and a concomitant volume resistivity of greater than 10E03 and less than 10E11 (OHM-CM).

DISCLOSURE OF THE INVENTION

The present invention provides component carrier tape of the type described above that is particularly suitable to transport components from a component supplier to a user that assembles the components into new products (such as but not limited to a computer), which carrier tape protects the component from damage from mechanical or electrostatic forces such as the forces encountered during transportation. The component carrier tape of the present invention is particularly suitable for protecting an electrical component comprising a rectangular shaped body having side walls defining corners, top and bottom walls and a plurality of leads spaced from the corners and which project generally normally away from the side walls and extend below the bottom wall, since the carrier tape minimizes the structure of the tape in proximity to the leads.

The carrier tape of the present invention provides a tape strip which maintains the desired orientation of the component with respect to the tape prior to removal and resists movement of the component relative to the tape, which minimizes the danger of electrostatic discharge from the component to the tape, which minimizes potential contact points between the tape structure and the leads of an electronic component to reduce frictional wear, which protects the leads of an electronic component from damage due to mechanical deflection or distortion and electrical static discharge, which affords orderly removal of the carried component from the tape pocket by automated or robotic assembly mechanisms which include a vacuum pick-up, and which deters rotation of the component with respect to the bottom wall of the pocket during the removal of the component from the pocket.

According to the present invention there is provided a unitary flexible carrier tape comprising a strip like portion defining a top surface for the tape, and wall portions defining a plurality of similarly-shaped pockets spaced along the tape and opening through the top surface. The wall portions include bottom wall portions, side wall portions extending between the strip like portion and the bottom wall portions. The bottom wall portions include distal parts spaced from the top surface of the tape. The side wall portions include longitudinal parts extending between the top surface of the tape and the distal parts. The side wall portions also include castellation parts having portions inset from the longitudinal parts and having engagement surfaces adapted to engage surfaces of a carried component to retain that component in a desired, predetermined orientation.

The bottom wall portions may optionally include embossed parts projecting above the distal parts and having abutment surfaces spaced above the distal parts. When the embossed parts are included, the engagement surfaces of the castellation parts are generally located above the abutment surfaces.

According to one embodiment of carrier tape of the present invention the pockets have middle portions, the top surface of the strip defines a top plane, and the castellation parts having a cross-section in the top plane that is generally "W" shaped with the bottom of the "W" shapes facing the middle portions of the pockets. The abutment surfaces comprise four irregular hexagonal shaped surfaces having an axis about which the hexagonal shaped surface is symmetrical, and the abutment surfaces form "X" shapes in the bottom portions of the tape with the axes of adjacent abutment surfaces intersecting at the middle portions.

According to another embodiment of the invention each of the pockets have at least one of the castellation parts with a cross-section in the top plane that has a chamfered portion with the chamfered portion facing the middle portion of the pocket, and the abutment surfaces comprise annulus shaped surfaces.

According to yet another embodiment of the invention, the embossed parts are omitted affording abutment between the bottom wall portion of the tape and the bottom surface of the body of the component. This embodiment is particularly suitable for transporting a flip-chip or other component having sensitive, fragile portions projecting up and away from the body of the component.

BRIEF DESCRIPTION OF THE DRAWINGS

The present invention will be further described with reference to the accompanying drawing wherein like reference numerals refer to like parts in the several views, and wherein.

DETAILED DESCRIPTION

Figure 1:
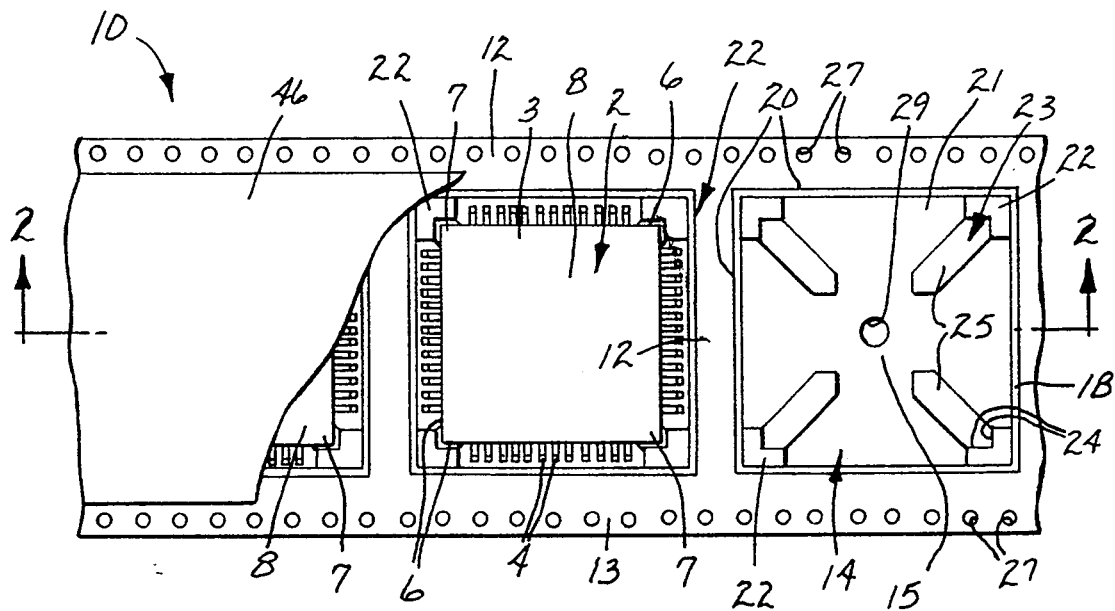
FIG. 1 is a fragmentary top view of a first embodiment of a carrier tape according to the present invention showing the carrier tape carrying an electronic component.
Figure 2:
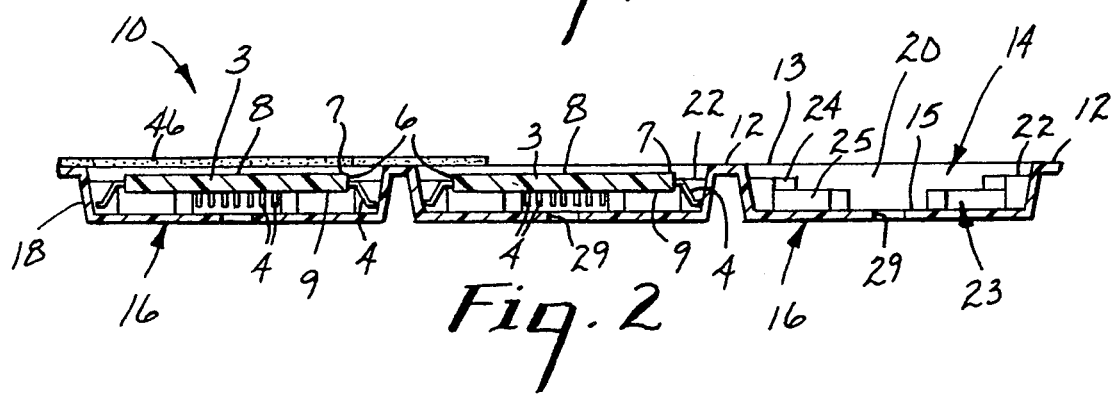
FIG. 2 is a sectional view of the carrier tape and electronic component of FIG. 1 taken approximately along lines 2—2 of FIG. 1.

Referring now FIGS. 1 through 4 of the drawing, there is shown a first embodiment of carrier tape according to the present invention generally designated by the reference numeral 10. The carrier tape 10 is used to transport components from a component manufacturer to a different manufacturer that assembles the components into new products, typically by having automated assembly equipment sequentially remove components from the carrier tape and subsequently use them in the assembly of the new products. FIGS. 1 and 2 illustrate an electronic component 2 carried by the carrier tape 10, but it is contemplated that the carrier tape 10 of the present invention may transport a variety of articles, including but not limited to torsion springs, leaf springs, lamps, light emitting diodes (LED's), optical articles such as optical fibers, dental products such as orthodontic brackets, electronic or electrical components such as resistors, flatpacks, capacitors, or integrated circuits etc.

Figure 4:
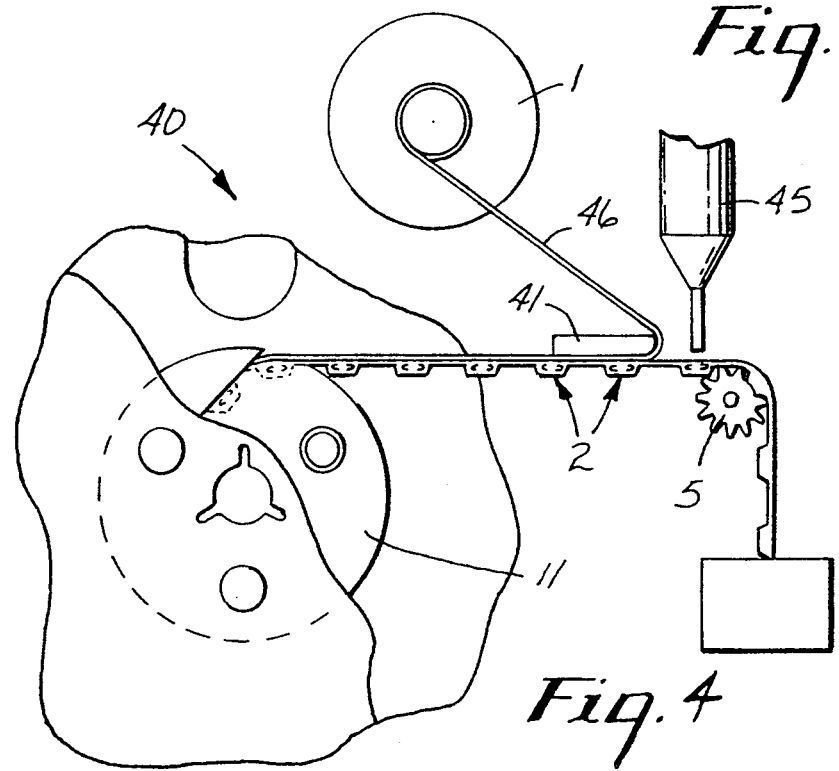
FIG. 4 schematically illustrates the removal of an electrical component from the carrier tape of the present invention by automated assembly equipment.
Figure 7:
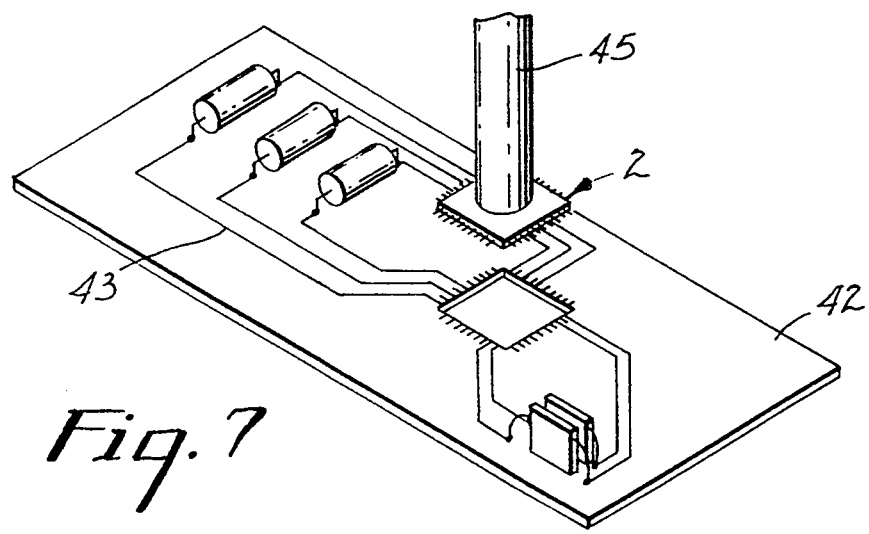
FIG. 7 is a perspective view illustrating the placement of an electrical component on a printed circuit board of a new product after the component has been removed from the carrier tape of the present invention.

The carrier tape 10 is particularly suitable for protecting and transporting an electronic component 2 such as a flatpack (i.e. gull wing, J-bend, small outline devices (SOIC's), thin small outline devices (TSOIC's), flip-chip components, or flying lead flatpacks) which may include a body 3 and at least one connector pin, solder bump or "lead" 4 which affords connection of the component 2 to an electrical circuit 43 on a printed circuit board 42 in the new product to be assembled by the assembly equipment 40 (FIGS. 4 and 7). The flatpack comprises a rectangular shaped body 3 having side walls 6 defining corners 7, top 8 and bottom 9 walls and a plurality of leads 4 which are spaced from the corners 7 that are free of leads 4. The leads 4 project generally normally away from the side walls 6 and extend below the bottom wall 9.

Alternatively, the electrical component may comprise a flip-chip (not shown) which comprises a relatively thin body portion with top and bottom surfaces having a series of solder bumps attached to the surface bearing the active circuitry. The solder bumps are very small and are particularly susceptible to wear such as the wear resulting from any frictional engagement with carrier tape.

Figure 3:
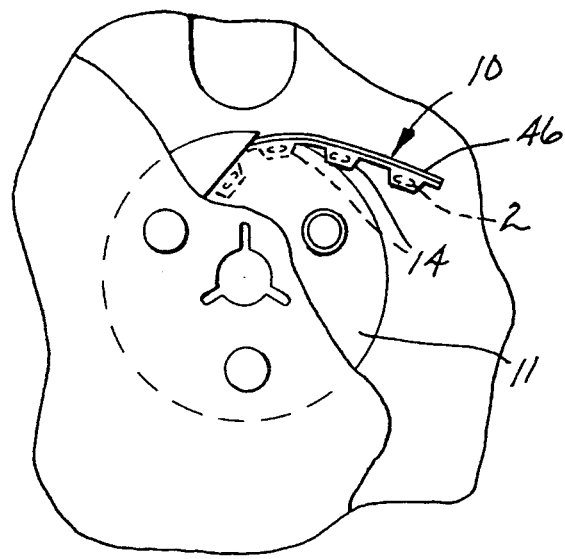
FIG. 3 is a fragmentary side view; partially in section of a reel having the carrier tape of the present invention helically wound thereon.

Generally, the carrier tape 10 is unitary, and may be constructed from any suitable thin polymeric material (e.g. any thermoplastic crystalline or non-crystalline material such as, but not limited to, polyester, polycarbonate, polypropylene, styrene, polyvinylchloride, acrylonitrile-butadiene-styrene copolymers (ABS plastic), copolymers etc.) such that the carrier tape is flexible and may be helically wound about the hub of a reel 11 (FIG. 3). The carrier tape 10 comprises a strip like portion 12 defining a top surface 13 for the tape 10, and wall portions defining a plurality of similarly-shaped pockets 14 spaced along the carrier tape 10 and opening through the top surface 13.

The wall portions comprise bottom wall portions 16, and side wall portions 18 extending between the strip like portion 12 and the bottom wall portions 16. The bottom wall portions 16 include distal parts 21 spaced from the top surface 13 of the tape 10 and embossed parts 23 projecting above the distal parts 21 and having abutment surfaces 25 spaced above the distal parts 21. The abutment surfaces 25 are adapted to abut the bottom walls 9 of the electronic components 2 to afford elevation of the electronic components 2 relative to the distal parts 21. The abutment surfaces 25 also afford spacing between the bottom portions of the leads 4 and the distal parts 21 (FIG. 2).

The side wall portions 18 include longitudinal parts 20 extending between the top surface 13 of the carrier tape 10 and the distal parts 21. The side wall portions 18 also include castellation parts 22 having portions located above the embossed parts 23 and inset from the longitudinal parts 20. The castellation parts 22 have engagement surfaces 24 adapted to engage the corners 7 of the electronic components 2 which are free of leads 4 to retain the electronic components 2 stationary with respect to the carrier tape 10 and to retain the orientation of the electronic component 2 relative to the carrier tape 10. The castellation parts 22 are also adapted to prevent rotation of the electronic components 2 relative to the bottom wall portions 16 during removal of the electronic components 2 from the pockets 14.

Referring now to FIGS. 1 and 2, the carrier tape 10 includes pockets 14 that have middle portions 15, the top surface 13 of the strip 12 defines a top plane, and the castellation parts 22 have a cross-section in the top plane that is generally "W" shaped with the bottom of the "W" shapes facing the middle portions 15 of the pockets 14.

Alternatively, the shape of the castellation parts 22 and engagement surfaces 24 may comprise any suitable shape which is adapted to closely receive generally identically shaped components 2 within the pockets 14 and which is adapted to engage portions (e.g. the corners 7) of the components 2 which are free of leads 4. The engagement surfaces 24 engage the corners 7 of the component 2 and thereby maintain the desired orientation of the component 2 with respect to the tape 10 prior to its removal and resists X-Y-Z plane and angular displacement of the component 2 relative to the tape 10.

The orientation of the component relative to the tape 10 is particularly important when automated assembly equipment 40 (FIGS. 4 and 7) is used. FIG. 4 schematically illustrates the removal of an electrical component 2 from the carrier tape 10 by automated assembly equipment 40. The automated assembly equipment 40 includes a drive sprocket 5 for sequentially advancing the pockets 14 filled with components 2 while simultaneously unwinding the carrier tape 10 from the reel. The equipment 40 typically includes a metal strip 41 and a take up reel 1 which peels an adhered, removable cover strip 46 from the tape 10 to expose the component 2. The exposed component 2 is then sequentially fed to a vacuum pick-up 45 which removes the components 2 and places them in an electrical circuit 43 on a printed circuit board 42 (FIG. 7).

The cover strip 46 may be adhered to the tape 10 by any suitable means such as a pressure sensitive tape located only along the edges of the tape 10 or by a hot melt adhesive along the edges of the tape 10.

If automated equipment 40 is used to remove a component 2 which is originally misaligned relative to the pocket 14, the automated assembly equipment 40 may transmit the misalignment of the component 2 relative to the tape 10 to a misalignment of the component 2 relative to the circuit board 42 (FIG. 7) which may result in a defective new product. One solution to this problem is to use a costly scanner for verifying the orientation of the component 2 on the vacuum pick-up 45. However, the engagement surfaces 24 of the present invention engage the corners 7 of the component 2 to preserve the orientation of the component 2 relative to the tape 10. Thus, the castellation parts 22 afford precise presentation of the component to automated equipment 40 and thereby assists the automated equipment 40 in mounting the components 2 in a precise location on the circuit board 42 on the resultant new product.

It should be noted that while the carrier tape 10 is particularly suitable for use with automated equipment, manual assembly is also contemplated. For example, the pockets 14 of the present invention may be adapted to transport articles such as orthodontic articles which are manually removed from the pockets 14 by the user.

It is also believed that the castellation parts 22 and engagement surfaces 24 protect an electronic component from damage due to electrostatic discharge from the component to the tape. Since the engagement surfaces 24 firmly retain the location of the component 2 relative to the tape 10 and deters relative motion therebetween, there is reduced frictional movement with which to build the electrostatic charges which may damage the component 2.

Additionally, the castellation parts 22 and engagement surfaces 24 afford orderly removal of the carried component 2 from the tape pocket 10 by automated or robotic assembly mechanisms 40 which include a suction or vacuum pick-up 45. The engagement surfaces 24 act as a barrier to deter any rotation of the component 2 relative to the tape 10 during the removal of the component 10 from the pocket 14. Preventing the component 2 from rotating as it is removed from the pocket 14 minimizes the potential for damage to the component from contact with the structure (i.e. the embossed parts 23) of the tape 10.

The abutment surfaces 25 comprise four irregular hexagonal shaped surfaces having an axis about which the hexagonal shaped surface is symmetrical, and the abutment surfaces 25 generally form "X" shapes (FIG. I) in the bottom portions 16 of the tape 10 with the axes of adjacent abutment surfaces 25 intersecting at the middle portions 15.

Alternatively the shape of the embossed parts 23 and abutment surfaces 25 may be any flat polygonal surface formed by straight portions or arcuate portions or combinations of straight and arcuate portions provided the overall affect is to position the leads 4 of the electronic component 2 above the distal parts 21 and to minimize potential contact points between the embossed parts 23 and the leads 4. For example, the embossed parts may comprise two parallel rectangular portions which are perpendicular to the longitudinal axis of the tape and spaced from the leads 4 of a component.

Locating the embossed parts 23 such that they are remote from the leads 4 of a carried electronic component 2 protects the leads 4 from damage due to mechanical deflection or distortion due to contact with the tape structure and at least partially insulates the leads 4 from damage due to electrical static discharge (e.g. triboelectric charging) from the component 2 to the tape 10. In some embodiments the embossed parts 23 may be completely omitted.

The carrier tape 10 also has a conventional series of equally spaced and sized through openings 27 along each edge of the strip like portion 12 which will receive the tooth of the drive sprocket 5 (FIG. 4) or sprockets by which the carrier tape may be driven through automated equipment (e.g. 40) which loads components into the pockets 14 or removes components from them. While the drawings illustrate through openings 27 along both edges of the strip like portion 12, it should be noted that the through openings may be present only along one edge of the strip like portion. Also, the carrier tape 10 has one through opening 29 generally centered in the bottom portion 16 of each of the pockets 14 as is required by an industry standard to allow the presence or absence of a component in a pocket 14 to be sensed, or to allow access for a probe that facilitates removal of a component from pocket 14.

Figure 5:
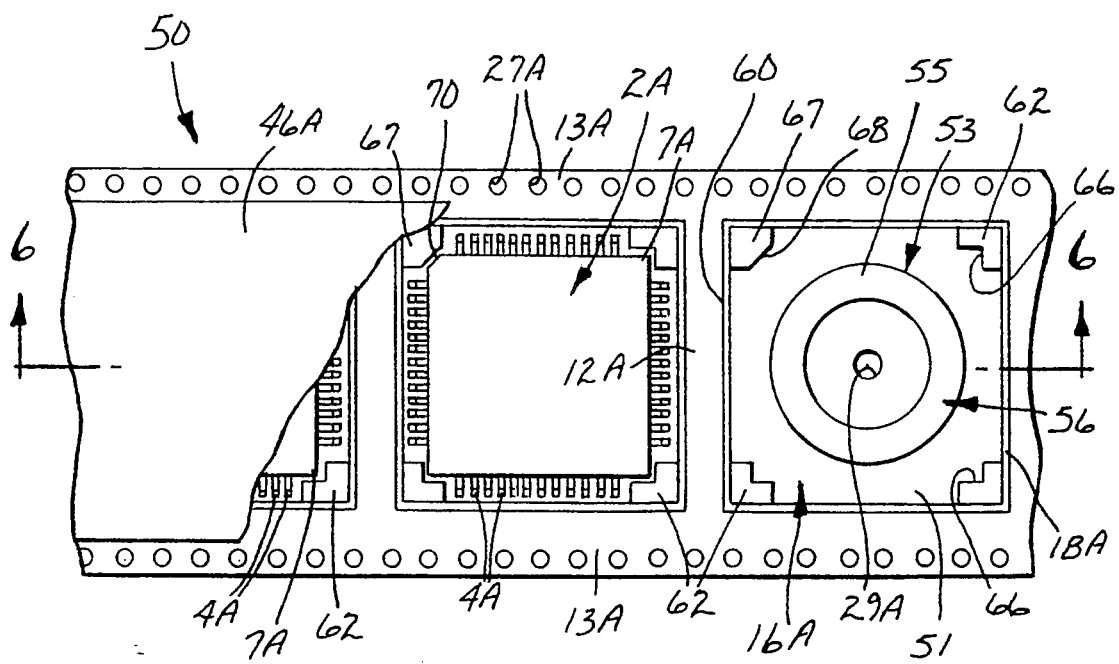
FIG. 5 is a fragmentary top view of a second embodiment of a surface mount carrier tape according to the present invention.
Figure 6:
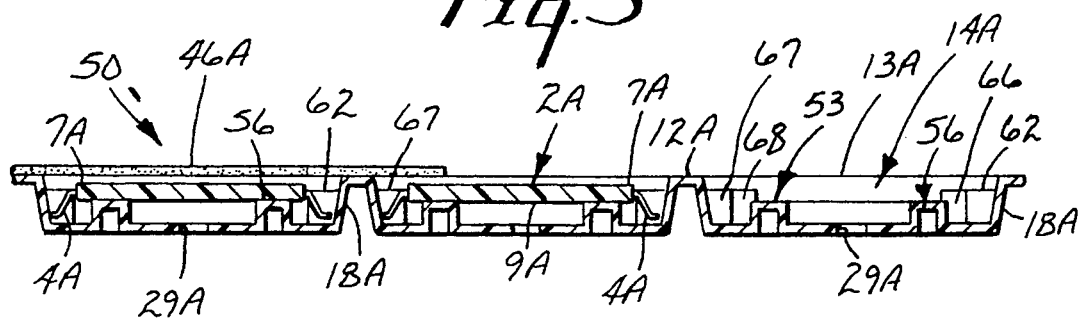
FIG. 6 is a sectional view of the carrier tape and electronic component of FIG. 5 taken approximately along lines 6—6 of FIG. 5.

Referring now to FIGS. 5 and 6 of the drawing, there is shown a second alternative embodiment of carrier tape according to the present invention, generally designated by the reference numeral 50 which has many parts that are essentially the same as the parts of the tape 10 and which have been identified by the same reference number to which the suffix "A" has been added. Generally, like the carrier tape 10, the carrier tape 50 is unitary and is also made of a thin polymeric material so that it is flexible. The carrier tape 50 comprises a strip like portion 12A defining a top surface 13A for the tape 50, and wall portions defining a plurality of similarly-shaped pockets 14A spaced along the carrier tape 50 and opening through the top surface 13A.

The wall portions comprise bottom wall portions 16A, and side wall portions 18A extending between the strip like portion 12A and the bottom wall portions 16A. The bottom wall portions 16A include distal parts 51 spaced from the top surface 13A of the tape 50 and embossed parts 53 projecting above the distal parts 51 and having abutment surfaces 55 spaced above the distal parts 51. The abutments surfaces 55 are adapted to abut the bottom walls 9A of the electronic components 2A to afford elevation of the electronic components 2A relative to the distal parts 51. The abutment surfaces 55 also afford spacing between the bottom portions of the leads 4A and the distal parts 51.

The side wall portions 18A include longitudinal parts 60 extending between the top surface 13A of the carrier tape 50 and the distal parts 51. The side wall portions 18A also include castellation parts 62 having portions located above the embossed parts 53 and inset from the longitudinal parts 60. Three of the four castellation parts 62 per pocket 14A are "W" shaped like the carrier tape 10 and have engagement surfaces 66 adapted to engage the corners 7A of the electronic components 2A which are free of leads 4A to retain the electronic components 2A stationary with respect to the carrier tape 50 and to retain the orientation of the electronic component 2A relative to the carrier tape 50. The castellation parts 62 are also adapted to prevent rotation of the electronic components 2A relative to the bottom wall portions 16A during removal of the electronic components 2A from the pockets 14A.

Unlike the carrier tape 10, one castellation part 67 of each pocket 14A of the carrier tape 50 includes a chamfered engagement surface 68 which is adapted to engage a similarly chamfered edge 70 of a component 2A. The existence of the chamfered engagement surface 68 and the chamfered edge 70 further ensures that the tape will present the component 2A to the automated assembly equipment 40 in the desired orientation relative to the tape 50 prior to its removal since the component will only "fit" in the pocket 14A in one manner (i.e. with the chamfered edge 70 adjacent the engagement surface 68). Thus, the castellation parts 62 and 67 further afford precise presentation of the orientation of the component 2A relative to the tape 50 to the automated assembly equipment 40. Such precise presentation contributes to locating the components 2A on the circuit board 42 of the resultant new product in a specific position.

Also unlike the carrier tape 10, the abutment surfaces 55 of the embossed parts 53 comprises an annulus shaped surface 56. Again, it should be pointed out that the shape of the abutment surfaces may comprise any shape formed from straight and arcuate portions or combinations of straight and arcuate portions including but not limited to circular, polygonal, rectangular, triangular, hexagonal, or a complex combination thereof provided the overall effect is to position the leads 4A of the electronic component 2A above the distal parts 51 and to minimize potential contact points between the embossed parts 53 and the leads 4A.

The carrier tape 50 also has a conventional series of equally spaced and sized through openings 27A along each edge of the strip like portion 12A which will receive the tooth of the drive sprocket or sprockets by which the carrier tape 50 may be driven through automated equipment which loads components into the pockets 14A or removes components from them. Also, the carrier tape 50 has one through opening 29A generally centered in the bottom portion 16A of each of the pockets 14A as is required by an industry standard to allow the presence or absence of a component in a pocket 14A to be sensed, or to allow access for a probe that facilitates removal of a component from pocket 14A.

Figure 8:
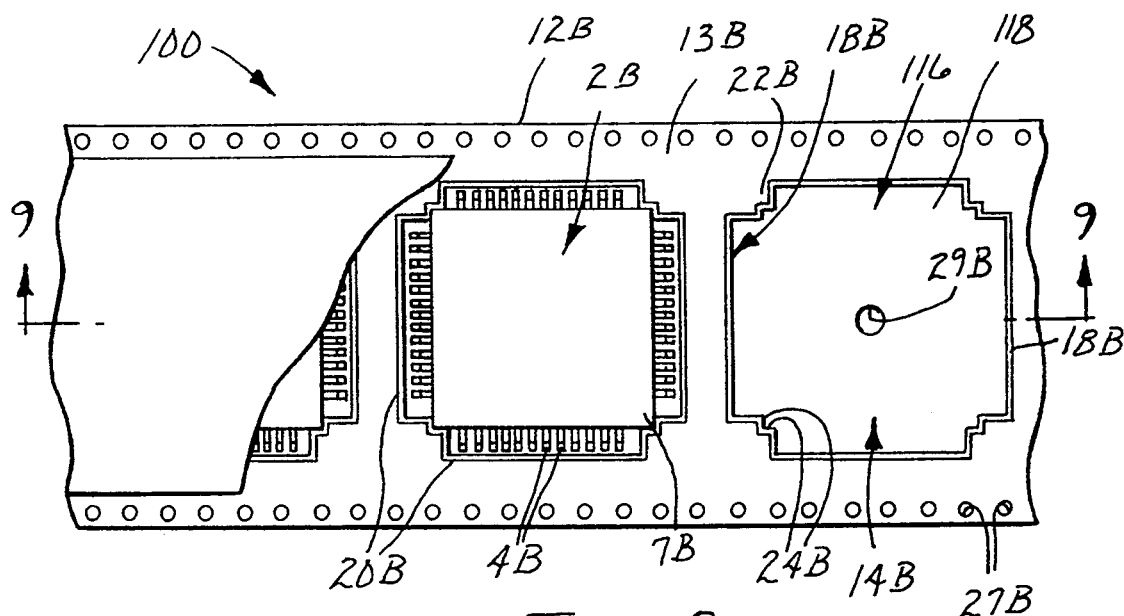
FIG. 8 is a fragmentary top view of a third embodiment of a surface mount carrier tape according to the present invention.
Figure 9:
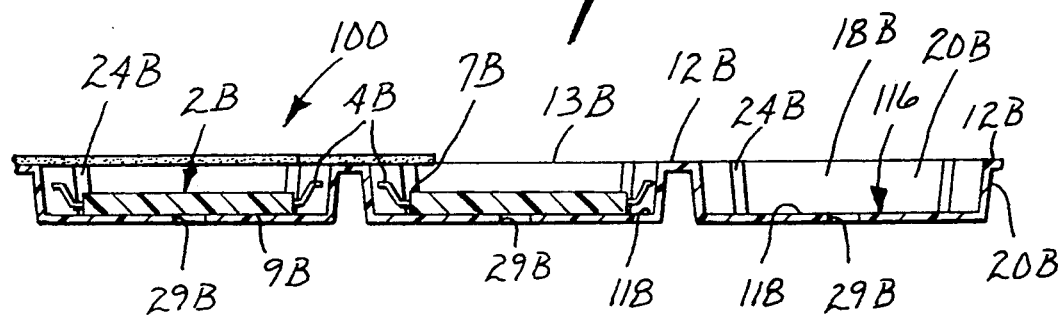
FIG. 9 is a sectional view of the carrier tape and electronic component of FIG. 8 taken approximately along lines 9—9 of FIG. 8.

Referring now to FIGS. 8 and 9 of the drawing, there is shown a third alternative embodiment of carrier tape according to the present invention, generally designated by the reference numeral 100 which has many parts that are essentially the same as the parts of the tape 10 and which have been identified by the same reference number to which the suffix "B" has been added. The carrier tape 100 is an example of an embodiment of the present invention where the embossed parts are omitted. A carrier tape 100 is particularly suitable to transport a flip-chip (not shown but which is an electronic component with a relatively thin body portion with top and bottom surfaces having a series of solder bumps attached to the surface bearing the active circuitry, such as the top surface).

Generally, like the carrier tape 10, the carrier tape 100 is unitary and is also made of a thin polymeric material so that it is flexible. The carrier tape 100 comprises a strip like portion 12B defining a top surface 13B for the tape 100, and wall portions defining a plurality of similarly-shaped pockets 14B spaced along the carrier tape 100 and opening through the top surface 13B.

The wall portions comprise bottom wall portions 116, and side wall portions 18B extending between the strip like portion 12B and the bottom wall portions 116. The bottom wall portions 116 include distal parts 118 spaced from the top surface 13B of the tape 100. The bottom walls 9B of the electronic components 2B abut the distal part 118 of the bottom wall portions 116 while the leads or solder bumps 4B project "upward" toward the opening of the pocket 14B.

The side wall portions 18B include longitudinal parts 20B extending between the top surface 13B of the carrier tape 100 and the distal parts 118. The side wall portions 18B also include castellation parts 22B having portions inset from the longitudinal parts 20B. The castellation parts 22B have engagement surfaces 24B adapted to engage the corners 7B of the electronic components 2B which are free of leads or solder bumps 4B to retain the electronic components 2B stationary with respect to the carrier tape 100 and to retain the orientation of the electronic component 2B relative to the carrier tape 100. The castellation parts 22B are also adapted to prevent rotation of the electronic components 2B relative to the bottom wall portions 116 during removal of the electronic components 2B from the pockets 14B.

The carrier tape 100 also has a conventional series of equally spaced and sized through openings 27B along each edge of the strip like portion 12B which will receive the tooth of the drive sprocket 5 (FIG. 4) or sprockets by which the carrier tape may be driven through automated equipment (e.g. 40) which loads components into the pockets 14B or removes components from them. Also, the carrier tape 100 has one through opening 29B generally centered in the bottom portion 116 of each of the pockets 14B as is required by an industry standard to allow the presence or absence of a component in a pocket 14B to be sensed, or to allow access for a probe that facilitates removal of a component from pocket 14B.

The present invention has now been described with reference to three embodiments thereof. It will be apparent to those skilled in the art that many changes can be made in the embodiment described without departing from the scope of the present invention. Thus the scope of the present invention should not be limited to the structure described in this application, but only by structures described by the language of the claims and the equivalents of those structures.

What is claimed is:

1. A unitary flexible carrier tape adapted to transport a plurality of electronic components, each of the components having a body including side walls defining corners, top and bottom walls, and at least one lead projecting from said side walls with the corners being free of the leads, said carrier tape comprising a strip like portion defining a top surface for said tape, and wall portions defining a plurality of similarly-shaped pockets spaced along said tape and opening through said top surface, said wall portions comprising:

bottom wall portions, side wall portions extending between said strip like portion and said bottom wall portions, said bottom wall portions including distal parts spaced from said top surface of said tape and embossed parts projecting above said distal parts and having abutment surfaces spaced above said distal parts, said abutment surfaces being adapted to abut the bottom walls of the electronic components to afford elevation of the electronic components relative to said distal parts, and said side wall portions including longitudinal parts extending between said top surface of said tape and said distal parts and castellation parts having portions located above said embossed parts and inset from said longitudinal parts, said castellation parts having engagement surfaces adapted to engage the portions of the side walls of the electronic components which are free of leads to retain the electronic components stationary with respect to said tape and to retain the orientation of the electronic components relative to said carrier tape, and said castellation parts being adapted to prevent rotation of the electronic components with respect to said bottom wall portions during removal of the electronic components from said pockets.

2. A unitary flexible carrier tape according to claim 1 wherein said pockets have middle portions, said top surface of said stripe defines a top plane, and at least one of said castellation parts have a cross-section in said top plane that is generally "W" shaped with the bottom of the "W" shape facing the middle portion of a respective pocket.

3. A unitary flexible carrier tape according to claim 2 wherein each of said pockets have at least one of said castellation parts defining a cross-section in said top plane that has a chamfered portion with the chamfered portion facing the middle portion of said pocket.

4. A unitary flexible carrier tape according to claim 1 wherein said pockets have middle portions, said abutment surfaces in each of said pockets comprise four irregular hexagonal shaped surfaces each having an axis about which the hexagonal shaped surface is symmetrical, and said abutment surfaces forming generally X-shapes in the bottom portions of said tape with the axes of adjacent abutment surfaces intersecting generally at said middle portions.

5. A unitary flexible carrier tape according to claim 1 wherein said abutment surfaces comprise annulus shaped surfaces.

6. In combination an electronic component having a body including side walls defining corners, top and bottom walls, and at least one lead projecting from said side walls with the corners being free of the leads, and a unitary flexible carrier tape comprising a strip like portion defining a top surface for said tape, and wall portions defining a plurality of similarly-shaped pockets spaced along said tape and opening through said top surface, said wall portions comprising:

bottom wall portions, side wall portions extending between said strip like portion and said bottom wall portions, said bottom wall portions including distal parts spaced from said top surface of said tape and embossed parts projecting above said distal parts and having abutment surfaces spaced above said distal parts, said abutment surfaces being adapted to abut the bottom wall of the electronic component to afford elevation of the electronic component relative to said distal parts, and said side wall portions including longitudinal parts extending between said top surface of said tape and said distal parts and castellation parts having portions located above said embossed parts and inset from said longitudinal parts, said castellation parts having engagement surfaces adapted to engage the portions of the side walls of the electronic component which are free of leads to retain the electronic component stationary with respect to said tape and to retain the orientation of the electronic component relative to said carrier tape, and said castellation parts being adapted to restrict rotation of the electronic component with respect to said bottom wall portions during removal of the electronic component from a pocket.

7. A combination according to claim 6 wherein said pockets have middle portions, said top surface of said strip defines a top plane, and at least one of said castellation parts have a cross-section in said top plane that is generally "W" shaped with the bottom of the "W" shape facing the middle portion of a respective pocket.

8. A combination according to claim 7 wherein each of said pockets have at least one of said castellation parts defining a cross-section in said top plane that has a chamfered portion with the chamfered portion facing the middle portion of said pocket.

9. A combination according to claim 6 wherein said pockets have middle portions, said abutment surfaces in each of said pockets comprise four irregular hexagonal shaped surfaces each having an axis about which the hexagonal shaped surface is symmetrical, and said abutment surfaces forming X-shapes in the bottom portions of said tape with the axes of adjacent abutment surfaces intersecting at said middle portions.

10. A combination according to claim 6 wherein said abutment surfaces comprise annulus shaped surfaces.

11. A unitary flexible carrier tape comprising a strip like portion defining a top surface for said tape, and wall portions defining a plurality of similarly-shaped pockets spaced along said tape and opening through said top surface, said wall portions comprising:

bottom wall portions, side wall portions extending between said strip like portion and said bottom wall portions, said bottom wall portions including distal parts spaced from said top surface of said tape and embossed parts projecting above said distal parts and having abutment surfaces spaced above said distal parts, and said side wall portions including longitudinal parts extending between said top surface of said tape and said distal parts and castellation parts having portions located above said embossed parts and inset from said longitudinal parts.

12. A unitary flexible carrier tape according to claim 11 wherein said pockets have middle portions, said top surface of said strip defines a top plane, and at least one of said castellation parts having a cross-section in said top plane that is generally "W" shaped with the bottom of the "W" shapes facing the middle portions of said pockets.

13. A unitary flexible carrier tape according to claim 12 wherein each of said pockets have at least one of said castellation parts defining a cross-section in said top plane that has a chamfered portion with the chamfered portion facing the middle portion of said pocket.

14. A unitary flexible carrier tape according to claim 11 wherein said pockets have middle portions, said abutment surfaces in each of said pockets comprise four irregular hexagonal shaped surfaces having an axis about which the hexagonal shaped surface is symmetrical, and said abutment surfaces forming X-shapes in the bottom portions of said tape with the axes of adjacent abutment surfaces intersecting at said middle portions.

15. A unitary flexible carrier tape according to claim 11 wherein said abutment surfaces comprise annulus shaped surfaces.

16. A unitary flexible carrier tape for transporting a plurality of components, each component having a body including side walls, corners, and a planar bottom wall, said tape comprising:
   (a) a strip portion defining a top surface of the tape, and
   (b) a plurality of similarly-shaped pockets for receiving the components, said pockets being spaced along the tape and opening through said top surface, each of said pockets having a middle portion, said pockets each comprising:
      (i) bottom wall portions, including distal parts spaced from said top surface of said carrier tape,
      (ii) abutment surfaces spaced above said distal parts and below said top surface of the tape, said abutment surfaces adapted to abut the bottom wall of the component to afford elevation of the component relative to said distal parts, and
      (iii) side wall portions extending between said strip portion and said bottom wall portions, said side wall portions including:
         (a) longitudinal parts extending between said top surface of said tape and said distal parts, and
         (b) castellation parts having portions inset from said longitudinal parts toward said middle portion of said pocket and having engagement surfaces for engaging the corners of the body of a component in the pocket, to retain the component in position relative to the carrier tape.

17. A unitary flexible carrier tape according to claim 16 wherein said top surface of said strip defines a top plane, and
at least one of said castellation parts have a cross-section in said top plane that is generally "W" shaped with the bottom of the "W" shape facing the middle portion of a respective pocket.

18. A unitary flexible carrier tape according to claim 16 wherein each of said pockets have at least one of said castellation parts defining a cross-section in said top plane that has a chamfered portion with the chamfered portion facing the middle portion of said pocket.

19. The unitary flexible carrier tape according to claim 16, wherein said abutment surfaces comprise an annular surface.

20. A unitary flexible carrier tape comprising a strip like portion defining a top surface for said tape, and wall portions defining a plurality of similarly-shaped pockets spaced along said tape and opening through said top surface, said wall portions comprising: bottom wall portions,
   side wall portions extending between said strip like portion and said bottom wall portions,
   said bottom wall portions including distal parts spaced from said top surface of said tape,
   wherein said bottom wall portions include embossed parts which project above said distal parts and have abutment surfaces spaced above said distal parts;
   said side wall portions including longitudinal parts extending between said top surface of said tape and said distal parts and
   castellation parts having portions inset from said longitudinal parts and having surfaces defining engagement surfaces, and
   said engagement surfaces of said castellation parts are located above said embossed parts.

21. A unitary flexible carrier tape according to claim 20 wherein each of said pockets have a middle portion,
   said abutment surfaces in each of said pockets comprise four irregular hexagonal shaped surfaces having an axis about which the hexagonal shaped surface is symmetrical, and
   said abutment surfaces forming X-shapes in the bottom portions of said tape with the axes of adjacent abutment surfaces intersecting at said middle portion of a respective pocket.

22. A unitary flexible carrier tape according to claim 20 wherein said abutment surfaces comprise annulus shaped surfaces.

23. A unitary flexible carrier tape adapted to transport an electronic component having a body including side walls defining corners, top and bottom walls, and at least one lead projecting from said side walls with the corners being free of the leads,
   said carrier tape comprising a strip like portion defining a top surface for said tape, and wall portions defining a plurality of similarly-shaped pockets spaced along said tape and opening through said top surface, said wall portions comprising:
   bottom wall portions including distal parts spaced from said top surface of said tape,
   side wall portions extending between said strip like portion and said bottom wall portions, and
   each of said pockets including embossed means for elevating said component relative to said distal parts, and
   each of said pockets including engagement means inset from said side wall portions, for engaging the component to retain the orientation of the component relative to said pocket until the component is removed from said pocket.

24. A unitary flexible carrier tape according to claim 23 wherein said embossed means comprises abutment surfaces spaced above said distal parts and below the top surface of said tape.

25. A unitary flexible carrier tape according to claim 24 wherein said abutment surfaces comprise annulus shaped surfaces.

26. A flexible carrier tape adapted to transport a plurality of electronic components, each of the components having a body including side walls, corners, a planar bottom wall, and a plurality of leads projecting from the side walls, the leads being inset relative to an outer periphery of the body defined by a line connecting each of the corners of the body, the carrier tape comprising:
   (a) a strip portion defining a top surface of the tape; and
   (b) a plurality of similarly-shaped pockets spaced along the tape and opening through said top surface, said pockets each comprising:
      (i) bottom wall portions spaced from said top surface of the tape, and (ii) side wall portions extending between said strip portion and said bottom wall portions, (iii) embossed parts situated between said bottom wall portions and said top surface, said embossed parts having abutment surfaces adapted to abut the bottom wall of the component to space the leads of the component from said bottom wall portions, and (iv) engagement surfaces located above the embossed parts and inset from said side walls toward the middle of the pocket, said engagement surfaces adapted to engage the corners of the components to retain the components in position relative to the carrier tape.

* * * * *